United States Patent

Ina et al.

[11] Patent Number: 5,357,147
[45] Date of Patent: Oct. 18, 1994

[54] WAVE-SHAPING APPARATUS

[75] Inventors: Hiroyuki Ina, Kariya; Takashi Harada, Hekinan; Masakazu Honda, Chiryu; Hiroyuki Ban; Tomohisa Yamamoto, both of Aichi, all of Japan

[73] Assignee: Nippondenso Co., Ltd., Kariya, Japan

[21] Appl. No.: 45,536

[22] Filed: Apr. 9, 1993

[30] Foreign Application Priority Data

Apr. 10, 1992 [JP] Japan .................. 4-090873

[51] Int. Cl.⁵ .................. H03K 5/153; H03L 7/06
[52] U.S. Cl. .................. 307/271; 307/358; 328/150
[58] Field of Search ............ 307/271, 358; 328/150

[56] References Cited

U.S. PATENT DOCUMENTS

| | | | |
|---|---|---|---|
| 3,801,830 | 4/1974 | Boyer | 307/358 |
| 3,852,616 | 12/1974 | Carp et al. | 307/526 |
| 4,214,299 | 7/1980 | Nakagaki et al. | 307/519 |
| 4,549,099 | 10/1985 | Yamada et al. | 307/359 |
| 5,015,878 | 5/1991 | Lasagna et al. | 307/358 |
| 5,015,879 | 5/1991 | Lasagna et al. | 307/358 |

FOREIGN PATENT DOCUMENTS 1-18604 4/1989 Japan .

Primary Examiner—Timothy P. Callahan
Assistant Examiner—Terry L. Englund
Attorney, Agent, or Firm—Cushman, Darby & Cushman

[57] ABSTRACT

An input signal processing apparatus for use in a comparator which compares an input signal with a reference voltage signal to output a signal inverted in accordance with a comparison result. The apparatus detects the frequency of an input signal from a rotation detecting device such as pickup coil so that a mask time is set in accordance with the detected input signal frequency. The apparatus separates the levels of the input signal and a reference signal to the comparator for the mask time. The mask time is set so as to vary with a first predetermined rate of change when the input signal frequency is below a predetermined frequency and vary with a second predetermined rate of change greater than the first predetermined rate of change when the input signal frequency is above the predetermined frequency. This arrangement can appropriately set the mask time whereby it is possible to prevent the phase shift in waveshaping when the frequency of the input signal is high.

18 Claims, 7 Drawing Sheets

WAVE-SHAPING APPARATUS

BACKGROUND OF THE INVENTION

The present invention relates to an input signal processing apparatus for use in a comparator which compares an input signal with a reference voltage signal to output a signal turned or inverted in accordance with a comparison result, and more particularly to such an input signal processing apparatus which relatively biases the input signal and the reference voltage signal in a direction corresponding to a varying direction of the input signal until a predetermined mask time is elapsed after the inversion of the output signal from the comparator.

Generally, for wave-shaping a periodically varying input signal such as a detection signal of a magnet pickup coil used as a rotational speed detecting device, a comparator is used which compares the input signal with a reference voltage signal to decide whether or not the input signal is higher than the reference voltage signal, so as to generate a pulse signal in accordance with the decision result. Here, in such a comparator there is the possibility that the output varies due to introduction of noises into the input signal. Accordingly, as exemplified by the Japanese Patent Publication No. 1-18604, such a comparator is equipped with an input signal processing apparatus whereby the input signal and the reference voltage signal are relatively biased along a direction depending on the varying direction of the input signal for a predetermined time period after the inversion of the output from the comparator so as to prevent a misdecision due to noises. Further, in the case of relatively biasing the input signal and the reference voltage signal after the inversion of the comparator output, if that time period (mask time) is fixed, when the frequency (input frequency) of the input signal is high, the mask time becomes longer than the inversion period of the input signal and hence the input signal and output signal of the comparator becomes different in phase from each other. On the other hand, when the input frequency becomes low, the mask time becomes shorter than the inversion period of the input signal. These cases cause the misdecision to tend to occur due to noises introduced after the elapse of the mask time. Thus, for example, as described in U.S. Pat. No. 4,549,099 (the Japanese Patent Provisional Publication No. 58-188923), the mask time is arranged to vary in accordance with the input frequency, thereby always providing a high noise-removing characteristic and a high phase characteristic.

In the case that, under the condition that the mask time varies in accordance with the input frequency, the frequency of the input signal such as a signal from a rotational speed sensor for detecting as a high rotational speed as several 10 to 10000 rpm widely varies, difficulty is encountered to match the input frequency with the mask time throughout the entire frequency range. In a conventional apparatus, as illustrated in FIG. 8A, in a range in which the frequency of the input signal is high (f>fmax), the mask time TM results in taking the saturated state. Thus, in the high-frequency range (f>fmax), the mask time TM becomes longer than the inversion period of the input signal, whereby there is a problem that the difference in phase between the input signal and output signal of the comparator occurs. That is, in the case that as illustrated in FIGS. 9A and 9B the reference voltage signal VTH is relatively biased or varied with respect to the input signal VIN to have a triangular configuration at every inversion of the comparator output VHL, when the input signal VIN is in a frequency range (f≦fmax) that the mask time TM can be set in accordance with the input frequency, it is possible to coincide the phase of the input signal VIN with the phase of the output signal VHL as illustrated in FIG. 9A, and on the other hand, when the input signal VIN is in a high-frequency range (f>f1) that the mask time TM cannot be set in accordance with the input frequency, the input signal VIN and the output signal VHL becomes different in phase from each other as illustrated in FIG. 9B. The phase shift amounts Δt1 and Δt2 become greater as the input frequency is higher.

One possible solution is to use a circuit which is capable of setting the mask time in accordance with the input frequency even if the input frequency widely varies. However, difficulty is countered to realize such a circuit in practice. That is, for example, for setting the mask time TM, a frequency-voltage converter (f/V converter) can be used where the inclination of its f/V conversion characteristic is small as indicated by a dotted line in FIG. 8B, thereby preventing the saturation of the mask time until reaching a high-frequency range. However, in this case, the mask time cannot be set accurately due to the error in the f/V converter, and hence there is the possibility that the phase shaft occurs in both the high-frequency range and low-frequency range. In addition, the use of the f/V converter having a high accuracy increases the cost of the apparatus. As a result, for preventing the increase in the cost of the input signal processing apparatus, use of an f/V converter having an f/V conversion characteristic that the mask time takes the saturated state in a high-frequency range as indicated by a solid line in FIG. 8B may be forced.

SUMMARY OF THE INVENTION

It is therefore an object of the present invention to provide a processing apparatus for an input signal of a comparator which is capable of easily suppressing the phase shift occurring when the input signal is in a high-frequency range without increasing the apparatus cost.

According to this invention, the frequency of the input signal is detected so that the mask time is set in accordance with the detected input signal frequency so as to be shorter as the input signal frequency becomes higher, and when the input signal frequency is higher than a predetermined frequency, the variation of the mask time relative to the input signal frequency is arranged to have a great value. That is, In a waveshaping apparatus for waveshaping an analog input signal into a rectangular output signal having a plurality of signal levels, there are provided an analog signal source for generating an analog input signal, a reference signal source for generating a reference signal corresponding to a reference signal level of the analog input signal, comparison means for comparing the analog input signal with the reference signal to vary the signal level of the output signal when the analog input signal reaches the reference signal level, mask means for separating the signal levels of the analog input signal and the reference signal in accordance with a varying direction of the analog input signal for a predetermined mask time after the analog input signal reaches the reference signal level, and mask time setting means for setting the mask time for the mask means to be shortened as a varying speed of the analog input signal increases, the setting means setting the mask time in accordance with a characteristic that a variation of the mask time made when the varying speed of the analog input signal is low is smaller than a variation of the mask time made when the varying speed of the analog input signal is high.

Preferably, the mask time setting means includes a circuit for detecting a frequency of a periodic variation of the analog input signal, a first current source for supplying a current, evenly varying between first and second frequencies, in accordance with the frequency detected by the detection circuit, a second current source for supplying a current, evenly varying between a third frequency and the second frequency, in accordance with the frequency detected by the detection circuit, the third frequency being between the first and second frequencies and a capacitor charged and/or discharged in accordance with the sum of the current from the first current source and the current from the second current source so that the mask time is set by its voltage variation.

According to this apparatus, the mask time is set in accordance with the input signal frequency, while the rate of change (variation) of the mask time with respect to the input signal frequency is set to a great value, whereby the mask time becomes short in the high-frequency range of the input signal and the input signal can be waveshaped without phase shift even if the mask time is in the saturated state when the input signal is in a high-frequency region. Further, the apparatus according to this invention can be constructed with a simple circuit because the frequency characteristic is changed in the high-frequency region without setting the mask time in correspondence with the frequency of the input signal.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

Figure 1:
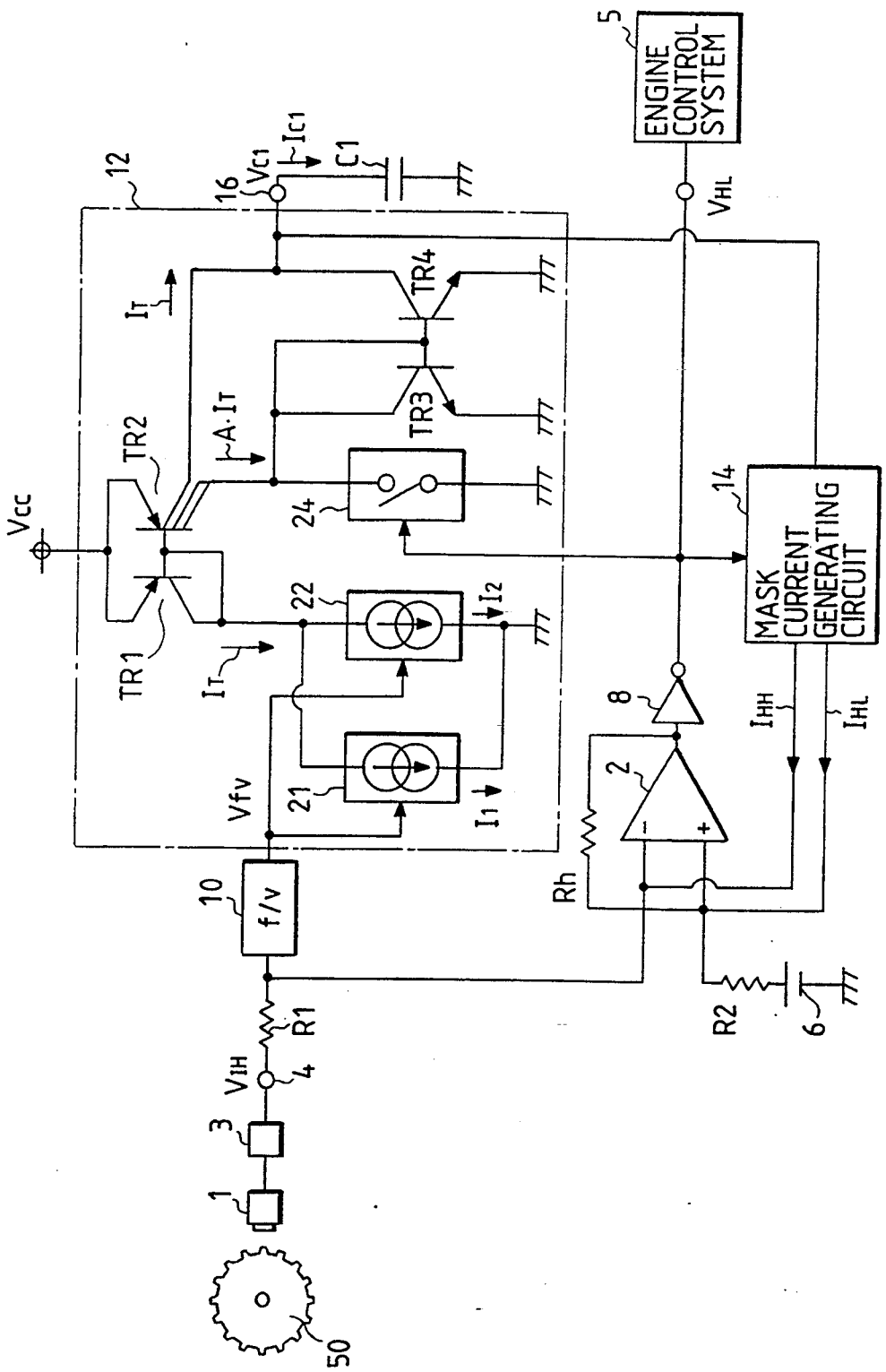
FIG. 1 shows an arrangement of an input signal processing apparatus according to an embodiment of this invention.

Referring now to FIG. 1, a description will be made hereinbelow in terms of an input signal processing apparatus according to an embodiment of this invention. In FIG. 1, designated at numeral 2 is a comparator which has a noninverting input terminal (+) and an inverting input terminal (−), the inverting input terminal (−) being coupled through a resistor R1 to an input terminal 4 for inputting a rotation signal VIN from a magnet pickup coil 1 representative of a rotational speed of an internal combustion engine and the noninverting input terminal (+) being coupled through a resistor R2 to a reference voltage source 6. The CR filter circuit 3 is for removing noises introduced. For the comparator 2, a well known Schmitt trigger is used which decides whether or not the rotation signal VIN is higher than a reference voltage signal inputted from the reference voltage source 6 to the noninverting input terminal (+) with a hysteresis characteristic being given to the reference voltage signal. As illustrated in (a) of FIG. 2, the reference voltage VTH to be compared in magnitude with the rotation signal VIN varies whenever the decision result changes (inverted). In this embodiment, a resistor Rh is provided between the noninverting input terminal (+) and output terminal of the comparator 2 so as to give a hysteresis characteristic. Further, the output terminal of the comparator 2 is coupled to an inverter 8 so as to output, through the inverter 8, a detection signal VHL obtained by waveshaping the rotation signal VIN to have a rectangular configuration as illustrated in (b) of FIG. 2. Thus, the detection signal VHL takes a low level when the rotation signal VIN is below the reference voltage VTH and takes a high level when the rotation signal VIN is above the reference voltage VTH. This detection signal VHL is led to an engine control system, denoted at numeral 5, which controls the fuel injection quantity, fuel injection timing, ignition timing or others in accordance with the detection signal VHL.

The input signal processing apparatus according to this embodiment increases the rotation signal VIN or the reference voltage VTH in accordance with the varying direction of the rotation signal VIN at every inversion of the detection signal VHL so as to accurately waveshape the rotation signal VIN without the comparator 2 being affected by noises superimposed on the rotation signal VIN. As shown in FIG. 1, the input signal processing apparatus includes an f/V converter 10 for converting the frequency f of the rotation signal VIN into a direct-current (dc) voltage Vfv and a control circuit 12 for charging and discharging a capacitor C1 in synchronism with the inversion period of the detection signal VHL as illustrated in (c) of FIG. 2 and further for controlling the charging and discharging current IC1 in accordance with the output voltage Vfv from the f/V converter 10. Also included in the apparatus is a mask current generating circuit 14 which limits a terminal voltage VC1 of the capacitor C1, charged and discharged by the control circuit 12, into a predetermined range VTH1 to VTH2 and respectively gives a mask current IMH, illustrated in (e) of FIG. 2, and a mask current IML, illustrated in (f) of FIG. 2, to the inverting input terminal (−) and noninverting input terminal (+) of the comparator 2 in accordance with the increasing and decreasing states (illustrated in (d) of FIG. 2) of the terminal voltage VC1.

Figure 3A:
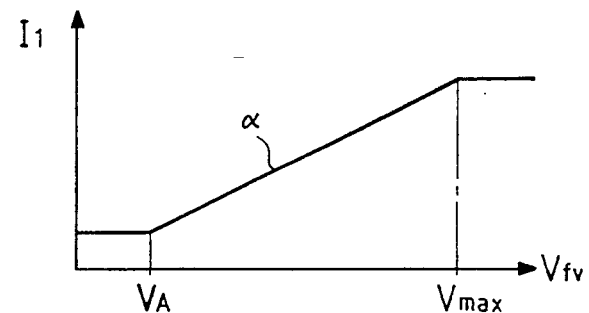
FIGS. 3A to 3C are graphic illustrations for describing a charging and discharging characteristic of a capacitor in the FIG. 1 input signal processing apparatus.
Figure 3B:
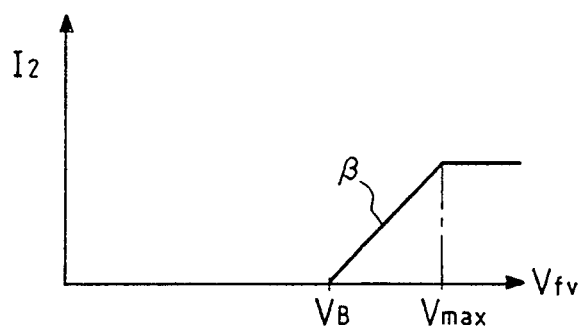

As shown in FIG. 3A, the control circuit 12 includes a first constant-current generating circuit 21 for generating a constant current I1 which varies with a predetermined rate of change (variation) α in accordance with the output voltage Vfv from the f/V converter 10 as illustrated in FIG. 3A and a second constant-current generating circuit 22 for generating a constant current I2 which varies with a predetermined rate of change β in accordance with the output voltage Vfv from the f/V converter 10 as illustrated in FIG. 3B when the output voltage Vfv therefrom is above a predetermined voltage VB. These constant-current generating circuits 21 and 22 are respectively coupled to the collector and base of a PNP transistor TR1, whose emitter is connected to a power source voltage Vcc, so that a current IT (=I1+I2) flows from the collector of the PNP transistor TR1 to the respective constant-current generating circuit 21 and 22 sides. Further, a PNP transistor TR2 is connected to the PNP transistor TR1 to form a current mirror so that currents IT and A•IT are taken from multi-collectors of the PNP transistor TR2.

Further, the current IT side collector of the PNP transistor TR2 is coupled to an external terminal 16 (connected to the capacitor C1), the mask current generating circuit 14 and an NPN transistor TR4 whose emitter is connected to a ground connection. On the other hand, the current A•IT side collector of the PNP transistor TR2 is coupled to one terminal of a switching circuit 24, the other terminal of which is grounded, and further coupled to a collector and base of an NPN transistor TR3 which is in turn coupled to the NPN transistor TR4 so as to form a current mirror. The switching circuit 24 operates in response to the detection signal VHL, more specifically, takes an ON state when the detection signal VHL takes the high level and takes an OFF state when the detection signal VHL takes the low level.

Figure 3C:
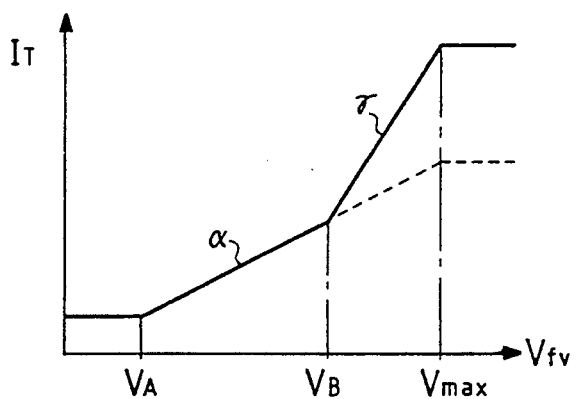

In the control circuit 12 thus arranged, as illustrated in FIG. 3C, the collector current IT of the PNP transistor TR1 increases with the rate of change α in accordance with increase in the output voltage Vfv of the f/V converter 10 (i.e., increase in the frequency f of the rotation signal VIN) while the output voltage Vfv of the f/V converter 10 becomes above the predetermined voltage VB, in other words, until the frequency f of the rotation signal VIN exceeds a predetermined frequency fB, and increases with the rate of change γ (=α+β) in accordance with increase in the frequency f after the frequency f of the rotation signal VIN becomes above a predetermined frequency fB. Here, in FIGS. 3A to 3C, Vmax represents the upper limit of the output voltage Vfv corresponding to the maximum frequency fmax which allows the f/V conversion of the rotation signal VIN by the f/V converter 10. The output voltage Vfv of the f/V converter 10 is saturated to Vmax in response to input of the rotational signal VIN exceeding the maximum frequency fmax.

Further, in the case that the detection signal VHL is in the high level state, the switching circuit 24 takes the ON state, and hence the NPN transistors TR3 and TR4 turn OFF, and on the other hand, in the case that the detection signal VHL is in the low level state, the switching circuit 24 tales the OFF state and therefore the NPN transistors TR3 and TR4 take the ON states, whereby the current A•IT flows through the respective transistors TR3 and TR4. Accordingly, as illustrated in (c) of FIG. 2, when the detection signal VHL is the high level, the current IT flows from the PNP transistor TR2 to the capacitor C1 side so as to charge the capacitor C1, and when the detection signal VHL is the low level, a current (A-1)•IT flows from the capacitor C1 to the NPN transistor TR4 side so that discharge from the capacitor C1 occurs.

Figure 4:
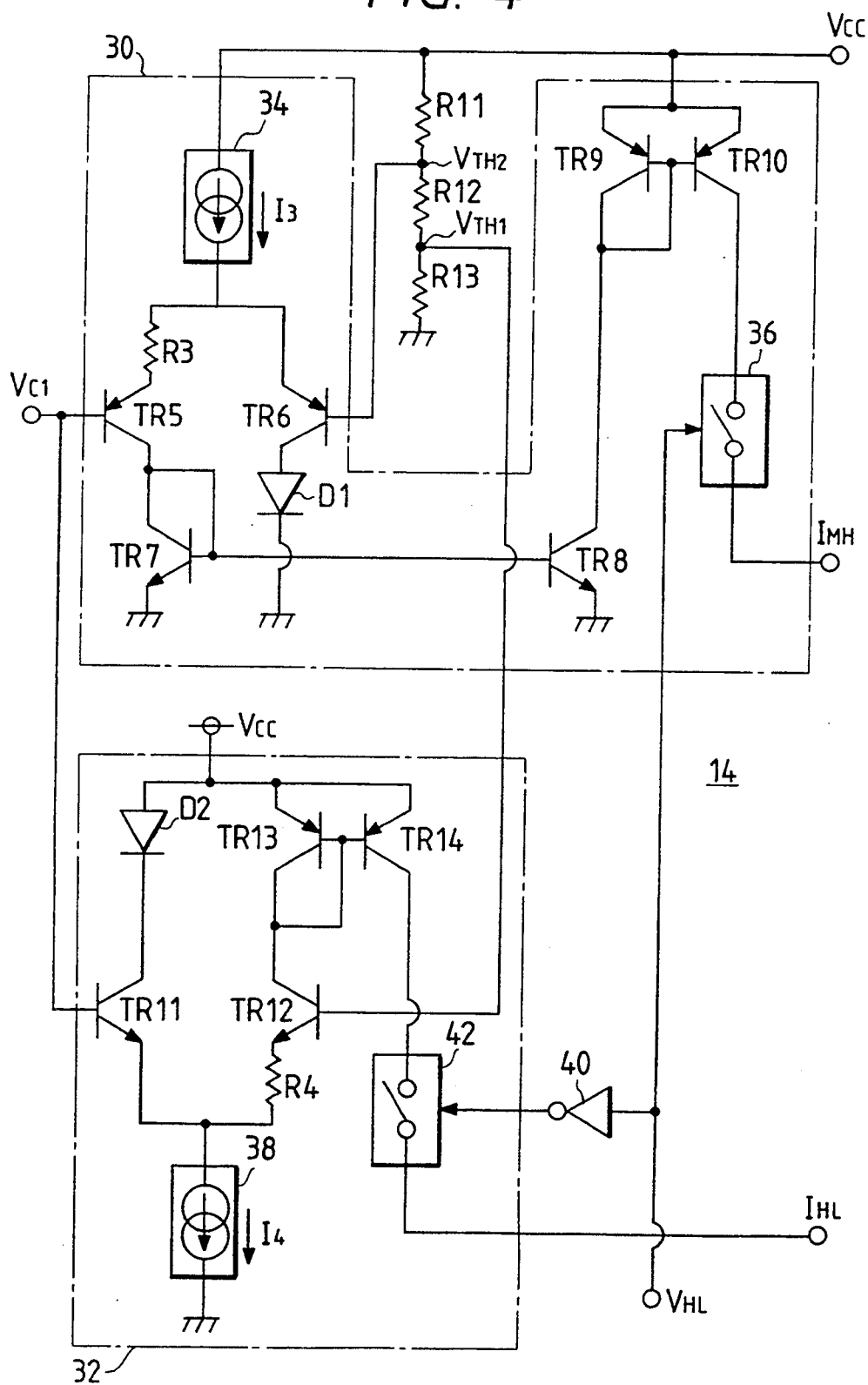
FIG. 4 shows an arrangement of a mask current generating circuit in the FIG. 1 input signal processing apparatus.

The mask current generating circuit 14, as shown in FIG. 4, comprises three voltage-dividing resistors R11 to R13 for dividing the power source voltage Vcc to set the lower and upper limit voltages VTH1 and VTH2 of the terminal voltage VC1, a rotation signal waveshaping circuit 30 for limiting the maximum terminal voltage VC1 to the upper limit value VTH2 and for supplying a mask current IMH to the inverting input terminal (−) of the comparator 2 when the terminal voltage VC1 increases due to the charging of the capacitor C1 so as to increase the rotation signal VIN to be inputted to the comparator 2, and a reference voltage waveshaping circuit 32 for limiting the minimum terminal voltage VC1 to the lower limit voltage VTH1 and for supplying a mask current IML to the noninverting input terminal (+) of the comparator 2 when the terminal voltage VC1 decreases due to the discharge of the capacitor C1 so as to increase a reference voltage waveform VTH for the comparator 2.

The rotation signal waveshaping circuit 30 is equipped with a constant-current generating circuit 34 to generate a constant current I3, and this constant-current generating circuit 34 is coupled through a resistor R3 to the emitter of a PNP transistor TR5 and coupled to the emitter of a PNP transistor TR6 so as to divisionally supply the constant current I3 to the respective transistors TR5 and TR6. Further, the terminal voltage VC1 of the capacitor C1 is applied to the base of the PNP transistor TR5, and the collector of the PNP transistor TR5 is coupled to the collector and base of an NPN transistor TR7 whose emitter is connected to a ground connection. On the other hand, to the base of the PNP transistor TR6 there is applied the upper limit voltage VTH2 developed by the aforementioned voltage-dividing resistors R11 to R13 and to the collector of the PNP transistor TR6 there is coupled the anode of a diode D1 whose cathode is grounded. Moreover, an NPN transistor TR8 is coupled to the NPN transistor 7 so as to form a current mirror, and the collector of the NPN transistor TR8 is coupled to the collector and base of a PNP transistor TR9 whose emitter is responsive to the power source voltage Vcc. Further, a PNP transistor TR10 is coupled to the PNP transistor TR9 so as to form a current mirror. To the collector of the PNP transistor TR10 there is connected a switching circuit 36 which takes the ON state when the detection signal VHL takes the high level. At the time of the switching circuit 36 turning ON, the current passing through the PNP transistor TR10 is outputted as the mask current IMH.

Furthermore, the reference voltage waveshaping circuit 32 is provided with a constant-current generating circuit 38 to generate a constant current I4, and this constant-current generating circuit 38 is coupled to the emitter of an NPN transistor TR11 and further coupled through a resistor R4 to the emitter of an NPN transistor TR12, the sum of the currents introduced from the respective transistors TR11 and TR12 thereinto being controlled to become the constant current I4. Further, to the base of the NPN transistor TR11 there is applied the terminal voltage VC1 of the capacitor C1, and to the collector thereof there is connected the cathode of a diode D2 whose anode is coupled to the power source voltage Vcc. On the other hand, to the base of the NPN transistor TR12 there is applied the lower limit voltage VTH1 developed by the above-mentioned voltage-dividing resistors R11 to R13, and to the collector thereof there are connected the collector and base of a PNP transistor TR13 whose emitted is responsive to the power source voltage Vcc. A PNP transistor TR14 is coupled to the PNP transistor TR13 so as to form a current mirror, and the collector of the PNP transistor TR14 is coupled to a switching circuit 42 which is in turn coupled through an inverter 40 to the detection signal VHL, the switching circuit 42 taking the ON state when the detection signal VHL is in the low level state. With the switching circuit 42 being in the ON state, the current flowing through the PNP transistor TR14 is outputted as the mask current IML.

Figure 2:
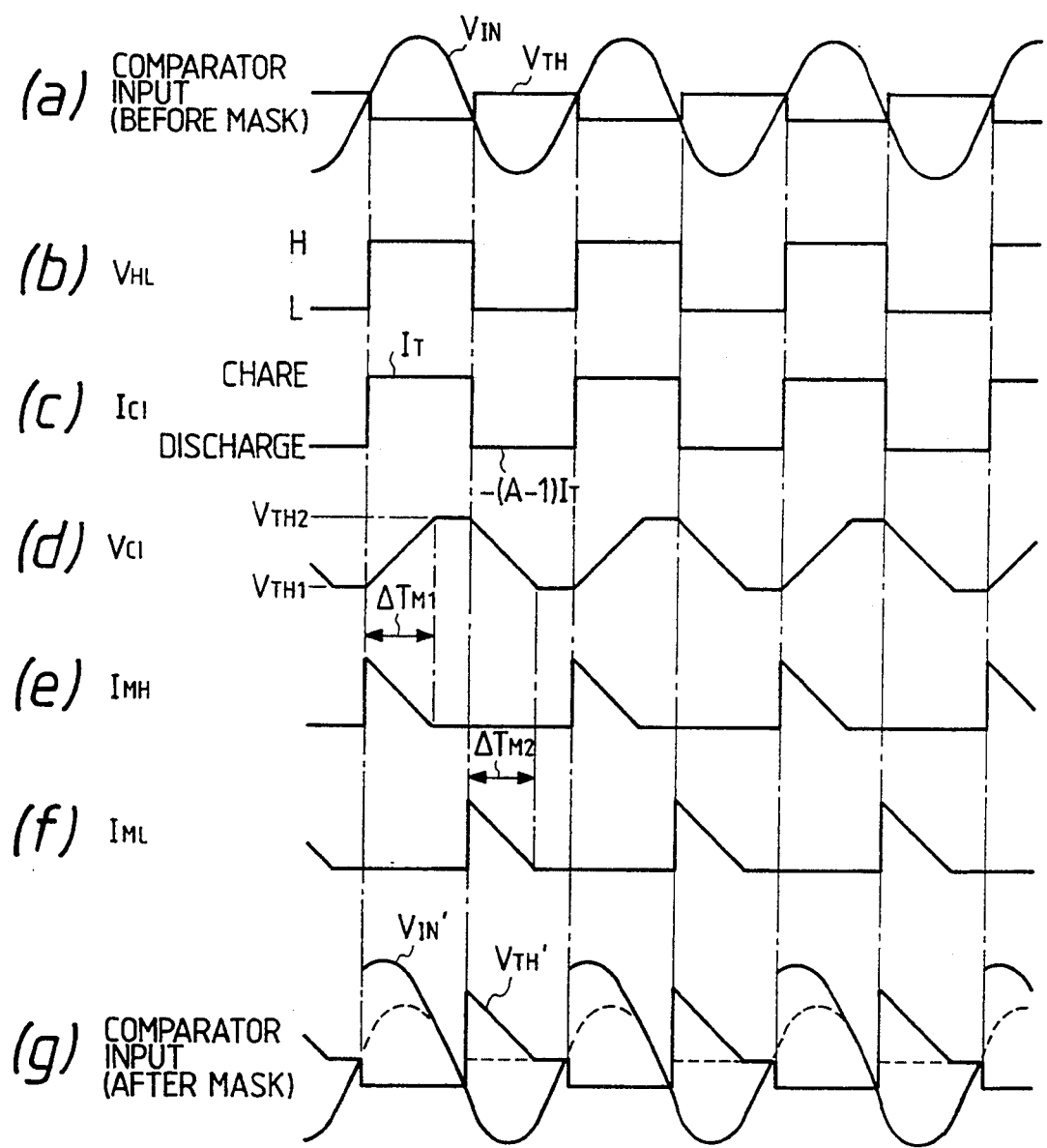
FIG. 2 is a timing chart for describing an operation of the FIG. 1 input signal processing apparatus.

In the mask current generating circuit 14 thus arranged, as illustrated in (e) of FIG. 2, when charging the capacitor C1, the rotation signal waveshaping circuit 30 generates the mask current IMH, decreasing in accordance with the increase in the terminal voltage VC1 of the capacitor C1, for a mask time ΔTM1, i.e., until the terminal voltage VC1 thereof reaches the upper limit voltage VTH2. Further, as illustrated in (f) of FIG. 2, when discharging the capacitor C1, the reference voltage waveshaping circuit 32 generates the mask current IML, decreasing in accordance with the terminal voltage Vc1, for a mask time ΔTM2, i.e., until the terminal voltage VC1 reaches the lower limit voltage VTH1. As a result, when charging the capacitor C1, a voltage corresponding to the mask current IMH is added to the inverting input terminal (−) of the comparator 2 for the mask time ΔTM1 that the rotation signal waveshaping circuit 30 outputs the mask current IMH, and when discharging the capacitor C1, a voltage corresponding to the mask current IML is added to the noninverting input terminal (+) of the comparator 2 for the mask time ΔTM2 that the reference voltage waveshaping circuit 32 outputs the mask current IML. Due to these voltages, the rotation signal VIN and the reference voltage VTH to be inputted to the comparator 2 are waveshaped to form a rotation signal VIN' and a reference voltage VTH' illustrated in (g) of FIG. 2.

Figure 5:
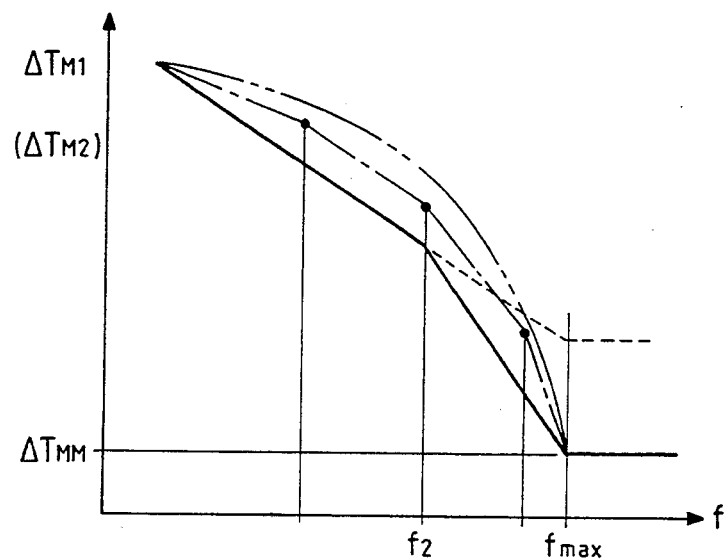
FIG. 5 is a graphic illustration for describing the characteristic of a mask time corresponding to a frequency of an input signal.

As described above, in the input signal processing apparatus for a comparator according to this embodiment, the rates of change of the charging current IT and discharging current (A-1)IT of the capacitor C1 with respect to the frequency of the rotation signal VIN are set to α until the frequency of the rotation signal VIN reaches a predetermined frequency and set to γ(=α+β) after the frequency of the rotation signal VIN exceeds the predetermined frequency. The rotation signal VIN and the reference voltage VTH to be inputted to the comparator 2 are waveshaped in accordance with the terminal voltage VC1 of the capacitor C1, charged and discharged by the currents varying with the rates of change α and γ set, for the mask time ΔTM1 or ΔTM2 that the terminal voltage VC1 varies from the lower limit voltage VTH1 to the upper limit voltage VTH2 or vice versa. Accordingly, as illustrated in FIG. 5, the aforementioned mask times ΔTM1 and ΔTM2 vary in correspondence with the frequency f of the rotation signal VIN with a constant rate of change until the frequency f reaches a predetermined frequency fB, and vary in correspondence therewith with a greater range of change until the frequency f reaches the upper limit frequency fmax, at which the output signal Vfv of the f/V converter 10 is in the saturated state, after the frequency f has reached the predetermined frequency fB. In this embodiment, the predetermined frequency fB corresponds to that the engine speed is about 2000 rpm and the upper limit frequency fmax corresponds to about 4000 rpm of the engine speed. Further, the minimum mask time ΔTMM is set to a time whereby the input signal can be binary-coded (processed to form a binary signal) without phase error when the engine speed is about 6000 rpm. Here, the predetermined frequency fB should be set to a frequency which does not generate the phase error when the engine takes the normal speed, and the minimum mask time ΔTMM should also be set to a time which does not generates the phase error even if the engine takes the maximum speed.

According to this embodiment, As compared with the prior art apparatus, the mask times ΔTM1 and ΔTM2 can be more shortened in a high-frequency region where the rotation signal VIN exceeds the predetermined frequency fB, and the rotation signal VIN can be waveshaped by the comparator 2 without occurrence of the phase shift in a frequency region of the input signal VIN exceeding the maximum frequency fmax.

Figure 6:
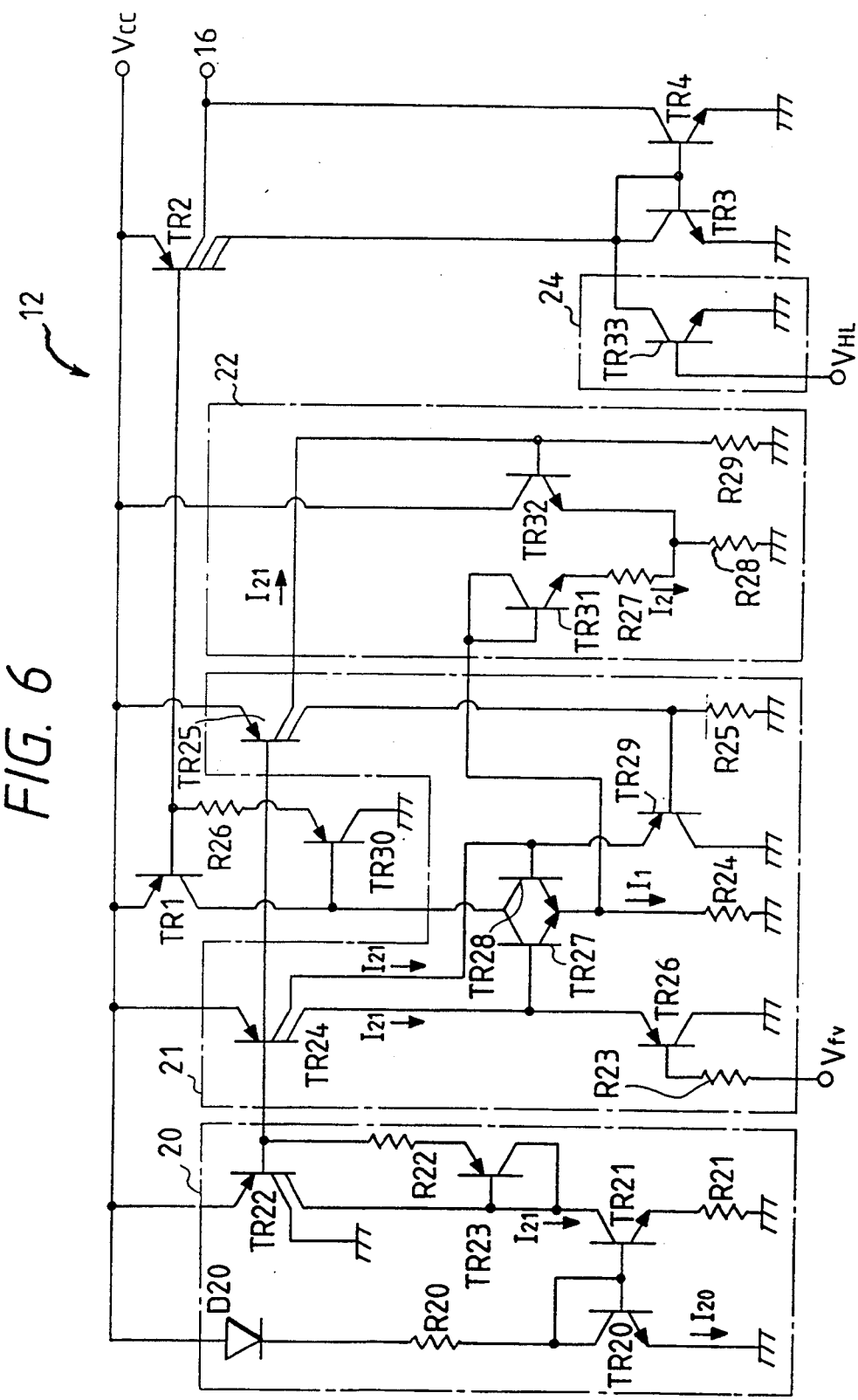
FIG. 6 is a circuit diagram showing an arrangement of a control circuit in the FIG. 1 input signal processing apparatus.
Figure 8A:
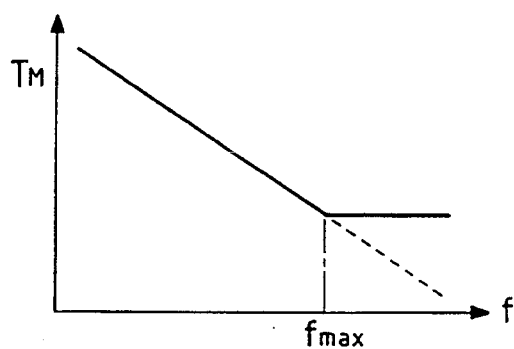
FIGS. 8A and 8B are illustrations for describing a mask time characteristic and f/V conversion characteristic corresponding to an input frequency in a conventional apparatus.
Figure 8B:
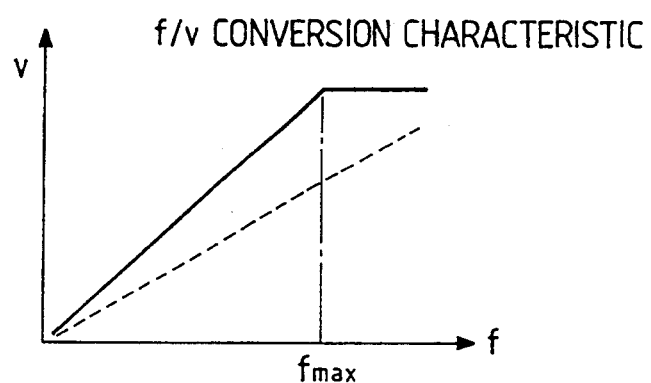
Figure 9A:
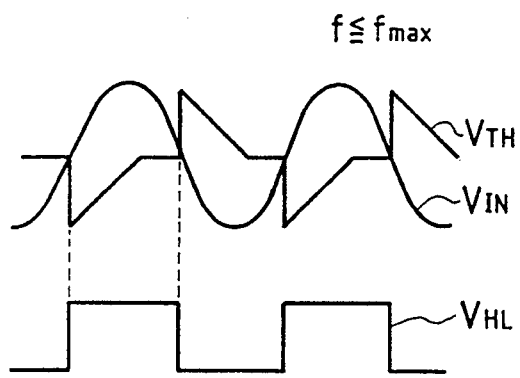
FIGS. 9A and 9B are illustrations for describing an output characteristic of a comparator in a conventional apparatus.
Figure 9B:
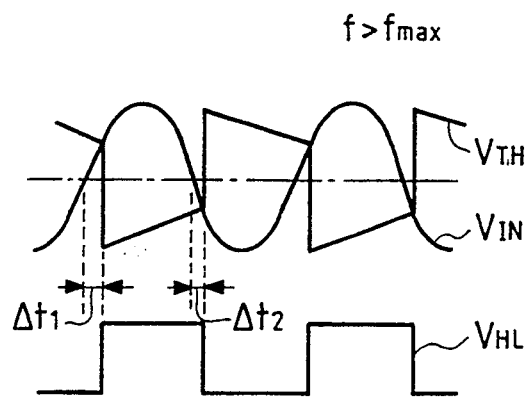

Although in this embodiment the control circuit 12 has been described as being merely composed of the constant-current generating circuits 21, 22 but the arrangements of the constant-current generating circuits 21, 22 are not described, the constant-current generating circuits 21, 22 can be arranged as being shown in FIG. 6, for example. A detailed arrangement of the control circuit 12 will be described hereinbelow with reference to FIG. 6.

As shown in FIG. 6, the control circuit 12, in addition to the aforementioned first and second constant-current generating circuits 21 and 22, comprises a constant-current generating circuit 20. This constant-current generating circuit 20 comprises a diode D20 coupled through its anode to the power source voltage Vcc, a resistor R20 connected through its one end to the cathode of the diode D20, and an NPN transistor TR20 whose collector and base are connected to the other end of the resistor R20 and whose emitter is grounded. The emitter current I20 becomes (Vcc-VD20-VBE20)/R20 where VD20: the forward voltage of the diode D20, VBE20: the base-emitter voltage of the transistor TR20, R20: the resistance value of the resistor R20. In addition, to the NPN transistor TR20 there is coupled a current mirror circuit comprising an NPN transistor TR21 and a resistor R21. The emitter current I20 (for example, 200 μA) is decreased to be I21 (for example, 50 μA) and then taken. The collector of the NPN transistor TR21 is connected to the collector of a PNP transistor TR22 and further connected to the base and collector of a PNP transistor TR23 whose emitted is coupled through a resistor R22 to the base of the PNP transistor TR22. These PNP transistors TR22, TR23 and resistor R22, together with PNP transistors TR24, TR25 in the first constant-current generating circuit 21, construct a current mirror circuit. Thus, the constant current I21 flows through the collectors of the PNP transistors TR24 and TR25 in the first constant-current generating circuit 21.

Further, in the first constant-current generating circuit 21, there is provided a PNP transistor TR26, the base of which is coupled through a resistor R23 to the output voltage Vfv of the f/V converter 10 so as to, when the output voltage Vfv is below a predetermined voltage VA, take the ON state to cause the collector of the PNP transistor TR24 to be connected to a ground connection. Moreover, to the junction point between the PNP transistors TR26 and TR 24 there is connected the base of an NPN transistor TR27 whose collector is coupled to the collector of the PNP transistor TR1 and whose emitter is connected through a resistor R24 to a ground connection. Further, to the collector and base of the NPN transistor TR27 there are respectively coupled to the collector and emitter of an NPN transistor TR28 the base of which is connected to the other collector of the PNP transistor TR24 and the emitter of a PNP transistor TR29 the collector of which is grounded. Here, the base of the PNP transistor TR29 is coupled through a resistor R25 to a ground connection and further coupled to one collector of the PNP transistor TR25. Further, The emitter of a PNP transistor TR30 collector-grounded is coupled through a resistor R26 to the base of the PNP transistor TR1 constituting a current mirror circuit together with the PNP transistor TR2, and the base of the PNP transistor TR30 is connected to the collector of the PNP transistor TR1.

In the first constant-current generating circuit 21 thus arranged, the NPN transistor TR27 turns OFF when the output voltage Vfv of the f/V converter 10 is below the predetermined voltage VA, and hence the value of the current I1 flowing through the resistor R24 becomes a constant current of VA/R24 where R24 represents the resistance value of the resistor R24. Further, in response to the output voltage Vfv of the f/V converter 10 becoming above the predetermined voltage VA, the NPN transistor TR28 turns ON and the NPN transistor TR27 turns ON, whereby the value of the current I1 flowing through the resistor R24 becomes Vfv/R24 and varies in accordance with the output voltage Vfv (i.e., the frequency f of the rotation signal VIN) of the f/V converter 10. Moreover, when the output voltage Vfv of the f/V converter 10 increases to exceed the maximum voltage Vmax (=Vcc-VBE1-VBE30-VCE27 where VBE1, VBE30: the collector-emitter voltages of the PNP transistors TR1 and TR30, VCE27: the collector-emitter voltage of the NPN transistor TR27, the PNP transistor TR26 turns OFF and the emitter of the NPN transistor TR27 is fixed to Vmax, whereby the current value I1 passing through the resistor R24 assumes Vmax/R24.

On the other hand, the second constant-current generating circuit 22 comprises an NPN transistor TR31 whose collector and base are connected to the resistor R24 of the first constant-current generating circuit 21, a resistor R27 whose one end is connected to the emitter of the NPN transistor TR31, a resistor R28 whose one end is connected to the other end of the resistor R27 and whose other end is grounded, a resistor R29 whose one end is connected to the collector of the PNP transistor TR25 of the first constant-current generating circuit 21 and whose other end is grounded, and an NPN transistor TR32 whose base is connected to the junction point between the resistor R29 and the collector of the PNP transistor TR25 and whose emitter is connected through the resistor R28 to a ground connection, the PNP transistor TR32, the collector of which is coupled to the power source voltage Vcc.

In the second constant-current generating circuit 22 thus arranged, when the output voltage Vfv of the f/V converter 10 is below a predetermined voltage VB, since the base-emitter voltage of the NPN transistor TR31 is low, the NPN transistor TR31 takes the OFF state so that the current I2 flowing through the resistor R27 becomes 0. However, in response to the output voltage Vfv of the f/V converter 10 exceeding the predetermined voltage VB, a difference voltage of (Vfv-VB) occurs between the emitter of the NPN transistor TR31 and the emitter of the NPN transistor TR32, and hence the current I2, being (Vfv-VB)/R27, passes through the resistor R27. Further, if the output voltage Vfv of the f/V converter 10 exceeds the maximum voltage Vmax, the base voltage of the NPN transistor TR31 is fixed to Vmax whereby the constant current I2 of (Vmax-VB)/R27 flows through the resistor R27. As a result, the collector current IT of the PNP transistor TR1 becomes the current value I1, flowing in the first constant-current generating circuit circuit 21, for a time period until the output voltage Vfv of the f/V converter 10 becomes above the predetermined voltage VB. In the state that the output voltage Vfv is above VB and below Vmax, the collector current IT of the PNP transistor TR1 becomes the sum of the current value I1 in the first constant-current generating circuit 21 and the current value I2 in the second constant-current generating circuit 22. Thus, as described above, the rate of change of the charging and discharging current of the capacitor C1 relative to the frequency f of the rotation signal VIN is changed between the case that the frequency f is below the predetermined frequency fB and the case that the frequency f is above the predetermined frequency fB.

In FIG. 6 control circuit 12, the switching circuit 24 is constructed with an emitter-grounded NPN transistor TR33 and the base of the NPN transistor TR33 receives the detection signal VHL so that the NPN transistor TR33 takes the ON state when the detection signal VHL is in the high level state, whereby the capacitor C1 is charged with the charging current IT. On the other hand, when the detection signal VHL is in the low level state, the NPN transistor TR33 takes the OFF state whereby the capacitor C1 is discharged with the discharging current (A-1)IT as shown in FIG. 2(c).

Although the detailed arrangement of the control circuit 12 has been described above, the control circuit 12 is not limited to this arrangement and the mask current generating circuit 14 can take various arrangements. For example, although in the above-mentioned embodiment the mask currents IMH and IMK are respectively supplied to the input terminals of the comparator 2 so as to waveshape the rotation signal VIN and the reference voltage VTH, since the prevention of the error decision due to noises superimposed on the rotation signal VIN can be effected by relatively changing the rotation signal VIN and the reference voltage VTH in accordance with the varying direction of the rotation signal VIN whenever the detection signal VHL from the comparator 2 inverts, it is also appropriate that a mask current is supplied in different directions to one input terminal of the comparator 2 at every inversion of the detection signal VHL from the comparator 2. Further, although in the above-described embodiment the mask currents IML and IMH are gradually decreased with the passage of time, it is also possible to add predetermined mask voltages to the rotation signal VIN and the reference voltage VTH for the mask times ΔTM1 and ΔTM2. Moreover, although in the above-described embodiment the output of the comparator 2 is outputted through the inverter 8, it is also appropriate that the rotation signal VIN is inputted to the noninverting input terminal (+) of the comparator 2 and the reference voltage source 6 is coupled through the resistor R2 to the inverting input terminal (−) of the comparator 2. In this case, it is possible to obtain the same detection signal VHL without using the inverter 8.

Figure 7:
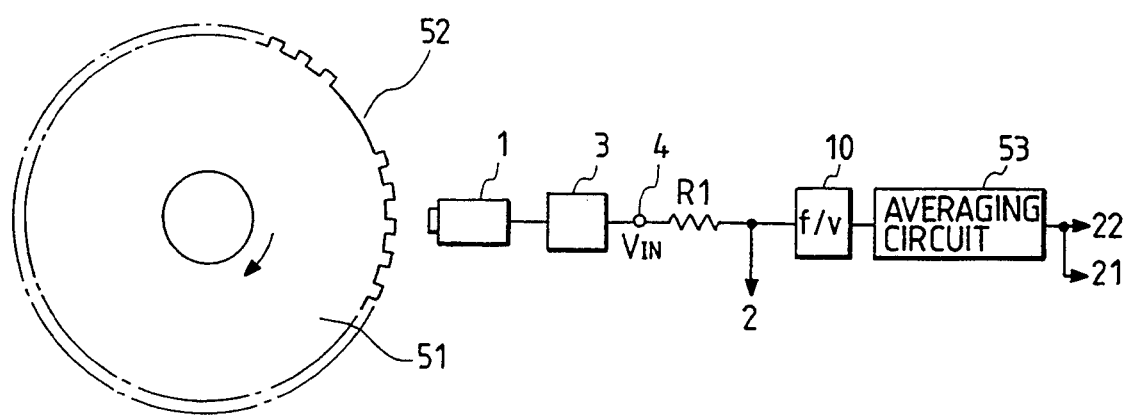
FIG. 7 shows an arrangement of a different pulser ring.

Further, although in the FIG. 1 embodiment a pulser (pulse-generating) ring 50 is used which has at its circumference of rotatable disc a plurality of projections arranged at an equal interval, it is also possible to use a pulser ring 51 as shown in FIG. 7. This pulser ring 51 is arranged such that a plurality of projections are formed on the circumference of its disc at an interval of 10° and the two projections of a portion, designated at numeral 52, are removed therefrom. The use of this pulser 51 allows detecting a rotational reference position of the engine by the detection of the projection-removed portion 52 concurrently with obtaining a signal corresponding to the rotation of the engine. The rotation signal produced such a pulser ring 51 is such that the signal variation does not occur at the projection-removed portion 52 and the frequency becomes low at the projection-removed portion 52. Accordingly, if the mask time is set in accordance with the frequency or period of the rotation signal Vin immediately before, the mask time subsequent to the projection-removed portion 52 is set to be long and a phase difference occurs between the rotation signal Vin and the binary-coded signal. However, the f/V converter 10 illustrated in FIG. 1 has a predetermined time lag and the output signal thereof varies in accordance with the average frequency of the input signal. Thus, the mask time can appropriately be set without being affected by the lowering of the frequency at the projection-removed portion 52, thereby preventing the phase difference from occurring between the wave subsequent to the projection-removed portion 52 and the corresponding binary-coded waveform. It is also appropriate to use an averaging circuit 53 to obtain the output corresponding to the average frequency of the input signal.

Furthermore, although in the above-described embodiment the kinked line characteristic is set so that the variation of the mask time becomes great when the frequency is above the predetermined frequency, the mask time can also be set to have a characteristic having a plurality of kinked lines as indicated by a dashed line in FIG. 5 or set to have a smoothly curved characteristic as indicated by a two-dot chain line in FIG. 5. In this case, if the variation of the mask time becomes small in a low-frequency region and becomes great in a high-frequency region, it is possible to surely remove noises in the low-frequency region and prevent the phase shift in the high-frequency region. Moreover, with use of one f/V converter as described above and a current source for determining the charging and discharging current for a mask time setting capacitor in accordance with the output of the f/V converter, the plural-kinked-line characteristic or the curved characteristic can be realized by a relatively simple circuit arrangement. Further, in the above-described embodiment there are provided the current source 21 for supplying a current with an inclination $\alpha$ until the frequency reaches fmax and the current source 22 for supplying a current with an inclination $\beta$ when the frequency exceeds a predetermined frequency f2, whereby the kinked-line characteristic as illustrated in FIG. 3C can be obtained. However, it is also appropriate to provide a current source for supplying a current with an inclination $\gamma$ until reaching the frequency fmax and a current source for supplying a current with an inclination $-\beta(\alpha=\gamma+(-\beta))$ until reaching the predetermined frequency f2 so as to obtain the kinked-line characteristic as illustrated in FIG. 3C.

Moreover, although in the above-described embodiment the analog input signal VIN is waveshaped to a digital signal having two (H and L) signal levels, this invention is also applicable to an apparatus which waveshapes an analog input signal into a rectangular wave signal having two or more signal levels. In this case, two or more reference signal levels are set. It is possible to prevent the phase shift occurring at the time that an analog input signal again intersects one reference signal level after intersecting the same reference signal level.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention.

What is claimed is:

1. A waveshaping apparatus for waveshaping an analog input signal into a rectangular output signal having a plurality of signal levels, said apparatus comprising:
    an analog signal source for generating an analog input signal;
    a reference signal source for generating a reference signal corresponding to a reference signal level of said analog input signal;
    comparison means for comparing said analog input signal with said reference signal to vary the signal level of said output signal when said analog input signal reaches said reference signal level;
    mask means for separating the signal levels of said analog input signal and said reference signal in accordance with a varying direction of said analog input signal for a predetermined mask time after said analog input signal reaches said reference signal level; and
    mask time setting means for setting said mask time for said mask means to be shortened as a varying speed of said analog input signal increases, said setting means setting said mask time in accordance with a characteristic that a variation of said mask time made when the varying speed of said analog input signal is low is smaller than a variation of said mask time made when the varying speed of said analog input signal is high.

2. An apparatus as claimed in claim 1, wherein said reference signal source generates said reference signal corresponding to one reference signal level, and said comparison means inverts the signal level of said output signal between two values.

3. An apparatus as claimed in claim 1, wherein said mask means, after said analog input signal reaches said reference signal level, gives a mask signal to said analog input signal and/or said reference signal to separate the signal levels of said analog input signal and said reference signal and then gradually decreases said mask signal for said mask time.

4. An apparatus as claimed in claim 1, wherein said mask time setting means decreases the variation of said mask time when the varying speed of said analog input signal is lower than a predetermined value and increases the variation of said mask time when said analog input signal is higher than said predetermined value.

5. An apparatus as claimed in claim 1, wherein said mask time setting means includes:

a circuit for detecting a frequency of a periodic variation of said analog input signal;

a first current source for supplying a current, evenly varying between first and second frequencies, in accordance with the frequency detected by said detection circuit;

a second current source for supplying a current, evenly varying between a third frequency and said second frequency, in accordance with the frequency detected by said detection circuit, said third frequency being between said first and second frequencies; and a capacitor charged and/or discharged in accordance with the sum of the current from said first current source and the current from said second current source so that said mask time is set by its voltage variation.

6. An apparatus as claimed in claim 1, wherein said mask time setting means sets a minimum mask time (ΔTMM), necessary when the varying speed (f) of said analog input signal takes an upper limit value, when the varying speed (f) of said analog input signal is above a predetermined value (fmax) lower than said upper limit value.

7. An apparatus as claimed in claim 6, wherein said mask time setting means includes a detection circuit for detecting a frequency (f) of a periodic variation of said analog input signal and a mask time setting circuit for setting said mask time in accordance with the frequency detected by said detection circuit, said mask time setting circuit setting said mask time in accordance with the frequency between a first frequency and a second frequency (fmax) lower than the upper limit value of the frequency of said analog input signal, and setting the minimum mask time (ΔTMM), necessary when the varying speed (f) of said analog input signal takes the upper limit value, when being in a frequency range above said second frequency (fmax).

8. An apparatus as claimed in claim 7, wherein said detection circuit is equipped with an f/V converter to output a voltage signal corresponding to the frequency of said analog input signal in a frequency range below said second frequency, the variation of said voltage signal being saturated when being above said second frequency.

9. An apparatus as claimed in claim 1, wherein said analog signal source comprises a moving body having a plurality of feature portions formed along its moving direction and a detector for detecting movement of said feature portions due to movement of said moving body to generate an analog-varying output.

10. An apparatus as claimed in claim 9, wherein said moving body is a rotating body having said plurality of feature portions arranged at an equal interval along its rotating direction.

11. An apparatus as claimed in claim 10, wherein said rotating body is arranged such that a portion of said plurality of feature portions is removed so as to form an unequally arranged portion.

12. An apparatus as claimed in claim 11, wherein said detector detects an average frequency throughout a plurality of periods of said analog input signal.

13. An apparatus as claimed in claim 1, wherein said mask time setting means gradually increases the variation of said mask time in accordance with increase in the varying speed of said analog input signal.

14. An engine rotation signal waveshaping apparatus for waveshaping an analog input signal, periodically varying in accordance with rotation of an engine, into a rectangular output signal having binary signal levels, said apparatus comprising:

engine rotation detecting means for generating an analog input signal periodically varying in accordance with the rotation of said engine;

a reference signal source for generating a reference signal corresponding to a reference signal level of said analog input signal;

comparison means for comparing said analog input signal with said reference signal to invert a signal level of said output signal when said analog input signal reaches said reference signal level;

mask means for giving a predetermined mask signal to said analog input signal and/or said reference signal to separate the signal levels of said analog input signal and said reference signal for a predetermined mask time after said analog input signal reaches said reference signal level;

means for detecting a frequency of said analog input signal; and mask time setting means for setting said mask time for said mask means to be shortened as the frequency of said analog input signal becomes higher, said setting means setting said mask time in accordance with a characteristic that a variation of said mask time made when the frequency of said analog input signal is low is smaller than a variation of said mask time made when the frequency of said analog input signal is high.

15. An apparatus as claimed in claim 14, wherein said mask time setting means sets said mask time in accordance with the frequency between a first frequency and a second frequency (fmax), and sets a minimum mask time (ΔTMM), necessary when the frequency (f) of said analog input signal takes an upper limit value, in a frequency range above said second frequency (fmax), said second frequency being lower than the upper limit value of the frequency of said analog input signal.

16. An apparatus as claimed in claim 15, wherein said detecting means is equipped with an f/V converter to output a voltage signal corresponding to the frequency of said analog input signal in a frequency range below said second frequency, a variation of said voltage signal being saturated when being above said second frequency.

17. An apparatus as claimed in claim 16, wherein said mask time setting means, setting said mask time in accordance with an output voltage of said f/V converter, comprises:

a capacitor for setting said mask time due to its charging time or discharging time; and a charging and discharging control circuit for adjusting a charging current and/or a discharging current of said capacitor in accordance with the output voltage of said f/V converter, said charging current and/or said discharging current are varied with a small inclination α in accordance with a variation of the output voltage of said f/V converter when the frequency of said analog input signal is low, and varied with a great inclination γ in accordance with the variation of the output voltage of said f/V converter when the frequency of said analog input signal is high.

18. An apparatus as claimed in claim 17, wherein said charging and discharging control circuit comprises:

a first current source for supplying a current, evenly varying between said first and second frequencies, in accordance with the frequency detected by said detecting means;

a second current source for supplying a current, evenly varying at a frequency below or above a third frequency, in accordance with the frequency detected by said detecting means, said third frequency being between said first and second frequencies; and a charging and discharging circuit for charging and/or discharging said capacitor in accordance with the sum of the current from said first current source and the current from said second current source.

* * * * *